United States Patent [19]

Nodera et al.

[11] 4,328,433
[45] May 4, 1982

[54] PROXIMITY SWITCH

[75] Inventors: Hisatoshi Nodera; Hiroyuki Yamasaki; Hiroyuki Miyamoto; Kenji Ueda, all of Nagakakyo, Japan

[73] Assignee: Omron Tateisi Electronics Co., Kyoto, Japan

[21] Appl. No.: 76,770

[22] Filed: Sep. 18, 1979

[30] Foreign Application Priority Data

Dec. 28, 1978 [JP]  Japan ................. 53-161907

[51] Int. Cl.³ ............... H03K 3/26; G08B 13/18
[52] U.S. Cl. .................... 307/311; 307/308; 307/252 P; 328/5
[58] Field of Search .......... 307/308, 311, 252 R, 307/252 P, 116; 328/5; 340/551, 2, 5, 561, 761; 200/DIG. 1; 361/119

[56] References Cited

U.S. PATENT DOCUMENTS

| | | | |
|---|---|---|---|
| 3,851,322 | 11/1974 | Compoly et al. | 340/530 |
| 3,969,672 | 7/1976 | Wallander et al. | 340/761 |
| 4,138,709 | 2/1979 | Colwill | 328/5 |
| 4,168,443 | 9/1979 | Periot | 328/5 |
| 4,193,023 | 3/1980 | Buck et al. | 328/5 |

Primary Examiner—Stanley D. Miller, Jr.
Assistant Examiner—B. P. Davis
Attorney, Agent, or Firm—Wegner & Bretschneider

[57] ABSTRACT

A proximity switch with two connecting wires for switching an alternating current is described. The switch comprises a rectifying circuit, a thyristor connected across the output terminals of the rectifying circuit, a stabilized power circuit connected across the output terminals for supplying a d.c. power to a detection circuit. The thyristor is provided with a triggering circuit which is connected between the anode and gate terminals of the thyristor and consists of a transistor and a Zener diode connected in series.

2 Claims, 3 Drawing Figures

PROXIMITY SWITCH

BACKGROUND OF THE INVENTION

This invention relates to a proximity switch and, more particularly, to a proximity switch with two connecting wires for switching an alternating current.

One of the known proximity switches has two connecting wires to be connected in series to a load and to a power source, which is a so-called two wire self-contained proximity switch. Power lines and output lines in such proximity switch are in common, so that it needs only two connecting wires and its switch action is similar to that of a limit switch. It is desirable that both the residual voltage under "ON" condition and the residual current under "OFF" condition are zero as in a limit switch.

A constant d.c. power supply, converted from an a.c. power source, to a detecting circuit, however, is required regardless of "ON" or "OFF" condition.

For this purpose, a certain value of residual voltage and of residual current must be retained. So it is very important in such proximity switch to minimize the residual voltage and residual current.

A proximity switch provided with an operation indicator is useful. A known proximity switch has an operation indicator consisting in a light-emitting diode. Such indicator, however, is preferably interposed in an electric circuit of the proximity switch not to increase the residual voltage or residual current. Further, it is desirable that the indicator of a normal-close type proximity switch operate only when an object is detected in the vicinity of a detecting means.

It is an object of this invention to provide a proximity switch of which residual voltage is low.

It is another object of this invention to provide a proximity switch of which residual current is low.

It is a further object of this invention to provide a proximity switch provided with an operation indicator which operates without an increase of residual voltage or residual current.

It is a still further object of this invention to provide a normal-close type proximity switch provided with an operation indicator which operates upon detection of an object in the vicinity of a detection means.

It should be understood that the term "proximity switch" is used herein to refer to any and all contactless switches which detect an object in the vicinity of its detection means such as a coil, capacitor or photodiode.

DETAILED DESCRIPTION OF THE PREFERRED EMBODYMENT

Figure 1:
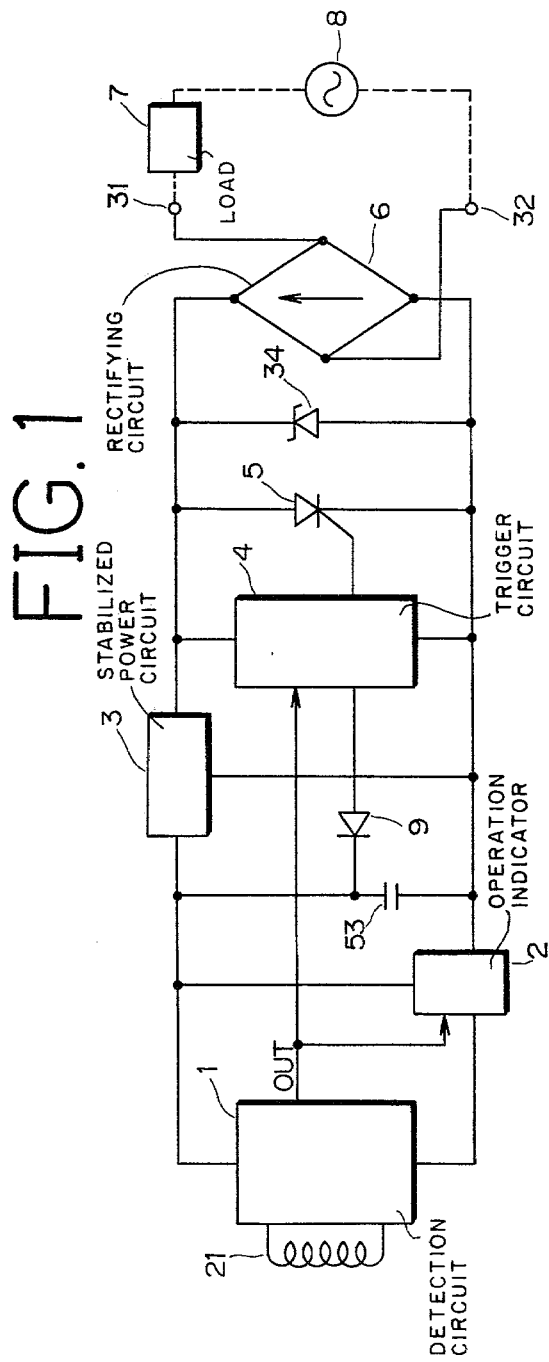
FIG. 1 shows, in block diagram, a preferred proximity switch in accordance with the present invention.
Figure 3:
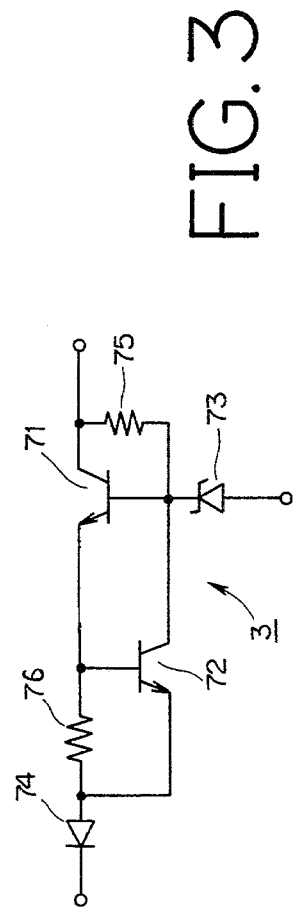
FIG. 3 is a detailed circuit of the stabilized power circuit shown in FIG. 1.
Figure 2:
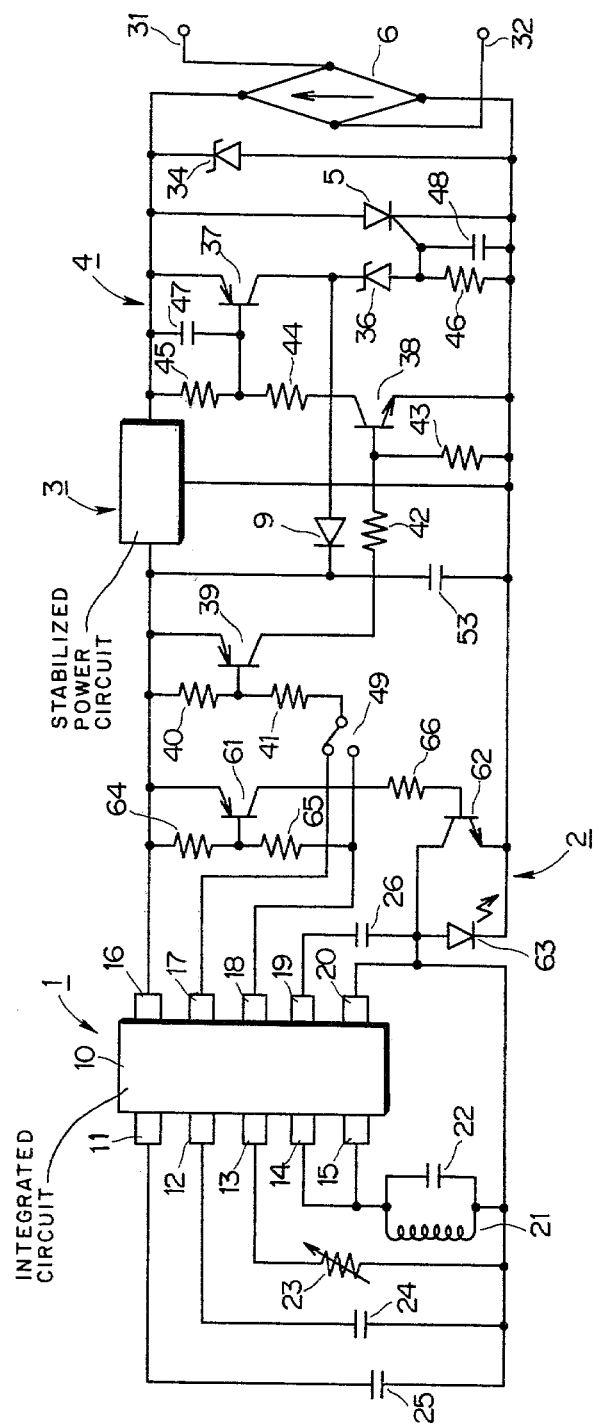
FIG. 2 is a detailed circuit of the proximity switch shown in FIG. 1.

Referring to FIG. 1 through FIG. 3, a proximity switch in accordance with the present invention comprises a detection circuit 1, an operation indicator 2, a stabilized power circuit 3, a trigger circuit 4, a thyristor 5, and a full-wave rectifier 6.

In FIG. 2, the detection circuit 1 comprises an integrated circuit 10 having terminals 11 through 20, a detection coil 21, capacitors 22, 24 and 25, and a variable resister 23. Coil 21 and capacitor 22 form a resonance circuit for a high-frequency oscillating circuit. Variable resister 23 is a means for adjusting the detection level.

The detection circuit 1 comprises, for example, a high-frequency oscillating circuit including a detection coil and a signal producing circuit for producing an output signal in response to a change of oscillating amplitude, a major portion of which may be integrated in a semiconductor chip. A variety of such detection circuits are well known, so that a detailed illustration of the circuitry is omitted in FIG. 2.

Terminals 16 and 20 are for power lines, and terminals 17 and 18 are for "normal high" output and "normal low" output, respectively.

The detection circuit 1 receives a d.c. power supply from a stabilized power circuit 3. An operation indicator 2 is connected to the detection circuit 1 in series, and comprises a light-emitting diode 63, a bypass transistor 62, a transistor 61, and resisters 64, 65 and 66.

The stabilized power circuit 3 comprises, as shown in FIG. 3, transistors 71 and 72, a Zener diode 73, a diode 74, and resisters 75 and 76. Trigger circuit 4 comprises transistors 37, 38 and 39, a Zener diode 36, resisters 40 through 46, and capacitors 47 and 48. The transistor 37 and Zener diode 36, connected in series, are connected between anode and gate electrodes of the thyristor 5. Zener diode 36 is for absorbing surge voltage. Recticying circuit 6 is a well-known bridge circuit. Input terminals 31 and 32 of the rectifying circuit 6 may be connected to a load 7 and an a.c. power source 8 which are connected in series, as shown in FIG. 1.

The operation of the proximity switch is now illustrated below. On application of an a.c. power to rectifying circuit 6, the stabilized power circuit 3, in cooperation with the smoothing capacitor 53, starts to feed a constant d.c. power to the detection circuit 1. The capacitor 26 prevents the detection circuit 1 from producing an output signal during a certain initial time period from power-on, so that no switching action will take place in the initial time period. After this initial time period, the detection circuit 1 produces output signals.

WHEN NO OBJECT EXISTS in the vicinity of the detecting means or detection coil 21, "normal high" output signal and "normal low" output signal appear at terminals 17 and 18, respectively. In this condition, since the resister 41 is connected to "normal high" terminal 17 through switch 49, transistors 39, 38 and 37 of the trigger circuit 4 are "OFF", the thyristor 5 is not turned on.

Transistors 61 and 62 are normally "ON", so that the current necessary for operating the detection circuit 1, which is approximately 1 mA, is bypassed by a bypass transistor 62, so that the light-emitting diode 63 is not energized. Since the bypass transistor 62 switches a very small current as mentioned above, resistors 65 and 66 may have very large resistance values, which allows the current flowing through transistors 61 and 62 to be lowered to a substantially negligible level.

Thus, insertion of the operation indicator circuit 2 causes only a negligible increase of residual current in the "OFF" condition of the proximity switch.

WHEN AN OBJECT EXISTS in the vicinity of the detection coil 21, "low" signal appears at "normal high" terminal 17 and "high" signal appears at "normal low" terminal 18. In this condition, transistors 39, 38 and 37 are "ON". As the supply voltage across the Zener diode 36 reaches the Zener voltage, the Zener diode 36 conducts, causing the thyristor 5 to be turned on. As to the transistor 37, PNP type is better than NPN type for providing a compact circuit.

While the thyristor 5 is turned on in every interval of a half-wave, an a.c. load current flows through the load 7. Since the Zener diode 36 of low Zener voltage can be used, turn-on angle of the thyristor 5 is less than that of the prior art circuit which, for example, is provided with two thyristors connected in series.

The small turn-on angle means a low average voltage between terminals 31 and 32 or a low residual voltage in "ON" condition.

The diode 9 connected between an output terminal of said stabilized power circuit 3 and the connection point of the transistor 32 to Zener diode 36 is not necessarily needed. It is, however, useful to lower the residual current as described below. When diode 9 is not connected, d.c. power supply to the detection circuit 1 is made available through stabilized power circuit 3 in both "ON" and "OFF" conditions. When diode 9 is connected, the power supply is made available through stabilized power circuit 3 under the "OFF" condition, while the power supply is made available through transistor 37 and diode 9 under "ON" condition.

During the thyristor 5 is not conducted, that is, when the rectified supply voltage across the Zener diode 36 is less than the Zener voltage and higher than the remaining voltage across the smoothing capacitor 53, the smoothing capacitor 53 is charged through the transistor 37 and diode 9. Since the stabilized power circuit 3 need to operate only under "OFF" condition, a resister 75 of large resistance value may be used to lower the current through Zener diode 73 and, hence, to lower the residual current.

In the "ON" condition, "high" output appears at terminal 18, and transistors 61 and 62 are turned off. Thus, the current necessary for operating the detection circuit 1 flows through light-emitting diode 63, resulting in an emission of light. Providing a "normal-close type" proximity switch or a "normal-open type" one is a matter of choice, which is made by a selection switch 49. In each type, the light-emitting diode 63 is energized in response to the detection of an object in the vicinity of the detection means.

What is claimed is:

1. A proximity switch with two connecting wires for switching an alternating current, comprising:
    a rectifying circuit;
    a thyristor for switching an alternating load current connected across output terminals of said rectifying circuit;
    a stabilized power circuit connected across the output terminals of said rectifying circuit;
    a detecting means;
    a detecting circuit receiving a power supply from said stabilized power circuit and producing an output signal in response to the presence of an object in the vicinity of said detecting means; and
    a trigger circuit for triggering said thyristor in response to said output signal, wherein said trigger circuit includes a transistor and a Zener diode connected in series between the anode and gate electrodes of said thyristor, said trigger circuit transistor being operable in response to the output signal from said detecting circuit, and further wherein a light-emitting semiconductor device is connected in series with said detecting circuit and a bypass transistor is connected to said light-emitting semiconductor device in parallel for bypassing the current which flows through the switch in response to the triggering of said thyristor by the output signal from said detecting circuit.

2. A proximity switch in accordance with claim 1, wherein said light-emitting semiconductor device is energized when an object is detected in the vicinity of a detection means in "ON" condition of the proximity switch.

* * * * *